United States Patent

Imamura

(10) Patent No.: US 9,457,629 B2
(45) Date of Patent: Oct. 4, 2016

(54) METHOD FOR GENERATING MESH MODEL

(71) Applicant: Sumitomo Rubber Industries, Ltd., Kobe-shi, Hyogo (JP)

(72) Inventor: Ao Imamura, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 335 days.

(21) Appl. No.: 14/177,442

(22) Filed: Feb. 11, 2014

(65) Prior Publication Data

US 2014/0278276 A1    Sep. 18, 2014

(30) Foreign Application Priority Data

Mar. 12, 2013   (JP) .................................. 2013-049487

(51) Int. Cl.
*G06F 17/50* (2006.01)
*B60C 99/00* (2006.01)
*G06T 17/20* (2006.01)

(52) U.S. Cl.
CPC ......... *B60C 99/006* (2013.04); *G06F 17/5018* (2013.01); *G06T 17/205* (2013.01); *G06F 17/5095* (2013.01)

(58) Field of Classification Search
USPC .................................................. 703/1, 2, 6
See application file for complete search history.

(56) References Cited

U.S. PATENT DOCUMENTS

| | | | | |
|---|---|---|---|---|
| 6,478,991 B1 * | 11/2002 | Mancosu | ............ | B29C 35/0288 264/326 |
| 6,781,582 B1 * | 8/2004 | Van Rens | ............... | G06T 17/20 345/420 |
| 7,286,972 B2 * | 10/2007 | Maker | ................. | G06F 17/5018 703/2 |
| 8,163,210 B2 * | 4/2012 | Ferro | ................. | B29D 30/0601 264/326 |
| 2008/0275672 A1 * | 11/2008 | Varon-Weinryb | .. | G06F 17/5018 703/1 |
| 2010/0030533 A1 | 2/2010 | Ueda et al. | | |
| 2012/0318418 A1 * | 12/2012 | Benzing, II | ......... | B60C 11/0311 152/155 |
| 2014/0110028 A1 * | 4/2014 | Benzing, II | ............... | B60C 7/14 152/250 |

FOREIGN PATENT DOCUMENTS

JP         2010-30459 A     2/2010

* cited by examiner

*Primary Examiner* — Thai Phan
(74) *Attorney, Agent, or Firm* — Birch, Stewart, Kolasch & Birch, LLP (57) ABSTRACT

A method for generating a two-dimensional mesh model of an object made up of a finite number of elements and provided with nodes is disclosed. Data about an original contour of the analysis object, including data about contour nodes are defined. The original contour is transformed by scaling up or down only in the direction of a predetermined first axis at a predetermined first scaling factor to obtain the transformed contour. Based on the contour nodes and additional nodes defined on the transformed contour, a primary mesh model whose contour is the same as the transformed contour is generated. By scaling the primary mesh model only in the direction of the first axis at a second scaling factor equal to the reciprocal of the first scaling factor, a secondary mesh model whose contour is the same as the original contour is generated.

7 Claims, 11 Drawing Sheets

METHOD FOR GENERATING MESH MODEL

BACKGROUND OF THE INVENTION

The present invention relates to a computer-implemented method for generating a mesh model according to which a two-dimensional mesh model which is efficient in a computer implemented numerical simulation can be easily generated.

In recent years, various computer-implemented numerical simulation methods have been suggested. (see Japanese Patent Application Publication No. 2010-030459 for example)

In order to perform such a numerical simulation, it is necessary to generate a mesh model representing an analysis object.

Heretofore, in order to generate a mesh model, firstly, data about the contour of the analysis object are entered in a computer. Such contour data include data about nodes which can specify the contour of the analysis object. For example, CAD data about the analysis object are used to prepare such contour data.

Next, by the computer, data about additional nodes are added to such contour data, and the space enclosed by the contour of the analysis object is divided into elements (meshing process). Such meshing is automatically performed by the computer, and usually, the density of the nodes in the X-axis direction is the same as that in the Y-axis direction. Namely, the space is automatically, uniformly divided into elements whose aspect ratios are substantially 1.

In the meantime, in a numerical simulation, a physical quantity is computed at the positions of nodes.

From a standpoint of the computational efficiency, it is desirable that the density of the nodes is relatively decreased in a direction in which the gradient of stress in the analysis object is relatively small, in other words, in a direction in which it is acceptable to relatively decrease the analytical accuracy.

on the other hand, in order to increase the analytical accuracy, it is desirable that the density of the nodes is relatively increased in a direction in which the gradient of stress in the analysis object is relatively large, in other words, in a direction in which the analytical accuracy is need to be increased.

Either case results in an element whose aspect ratio is not 1 (one), for example, horizontally long element or vertically long element.

In the case of a two-dimensional mesh model generated by automatic meshing, however, the nodes are defined so that the density of the nodes in the X-axis direction becomes substantially same as that in the Y-axis direction.
Therefore, the number of the elements is liable to increase needlessly.

In such mesh model, if it is desired to arbitrarily define the density of the nodes in a specific direction, it is need to manually change the positions of the nodes automatically, evenly defined by the computer.
Therefore, according to the conventional method for generating a mesh model, it takes much time and labor to create an efficient mesh model of an analysis object.

SUMMARY OF THE INVENTION

It is therefore, an object of the present invention to provide a method for generating a mesh model by which a two-dimensional mesh model of an analysis object, which is efficient in a computer implemented numerical simulation, can be easily generated.

According to the present invention, a computer implemented method for generating a two-dimensional mesh model of an analysis object, which model is made up of a finite number of elements and provided with a plurality of nodes, comprises a process in which data about an original contour of the analysis object, including data about contour nodes which can specify the original contour, are stored, a transform process in which the original contour is transformed by scaling the original contour only in the direction of a predetermined first axis at a predetermined first scaling factor to obtain data about the transformed contour, a mesh process in which, by defining additional nodes on the transformed contour in addition to the contour nodes, and by meshing based on all the additional nodes and the contour nodes, a primary mesh model whose contour is the same as the transformed contour is generated, an inverse transform process in which, by scaling the primary mesh model only in the direction of the first axis at a second scaling factor equal to the reciprocal of the first scaling factor, a secondary mesh model whose contour is the same as the original contour is generated as the two-dimensional mesh model of the analysis object.

In the case of the analysis object having a low-precision direction in which an analytical accuracy can be relatively reduced, it is preferable that, in the transform process, the original contour is scaled down only in the low-precision direction as the direction of the first axis.

In the case of the analysis object having a high-precision direction in which an analytical accuracy is required to be relatively increased, it is preferable that, in the transform process, the original contour is scaled up only in the high-precision direction as the direction of the first axis.

In the case that the analysis object is a tire, it is preferable that the original contour is a contour of the tire in a tire meridian section, and the direction of the first axis may be the direction of the axis of rotation of the tire or the direction perpendicular thereto.

Therefore, in the two-dimensional mesh model of the analysis object, the density of the nodes can be made different between the direction of the first axis and a direction perpendicular thereto.

For example, when the original contour is scaled up only in the first axis direction through the transform process, the density of the nodes in the first axis direction in the secondary mesh model becomes larger than that in the primary mesh model. Therefore, in a simulation utilizing such secondary mesh model, physical quantity computed at the positions of the nodes is computed densely in the first axis direction, and accordingly, the analytical accuracy is improved.

In contrast, when the original contour is scaled down only in the first axis direction through the transform process, the density of the nodes in the first axis direction in the secondary mesh model becomes smaller than that in the primary mesh model.
Therefore, in a simulation utilizing such secondary mesh model, high analytical accuracy can be obtained, while the number of the elements is decreased when compared with a mesh model of which node density is decreased in every direction.

DESCRIPTION OF THE PREFERRED EMBODIMENTS

Embodiments of the present invention will now be described in detail in conjunction with accompanying drawings.

The method according to the present invention is to generate a two-dimensional mesh model M2 of an analysis object 2, which model is provided with a plurality of nodes 3 and 5 and made up of a finite number of elements 6, by the use of a computer 1.

The analysis object 2 is not limited to a specific thing as far as the analysis object 2 has a certain area. Typically the analysis object 2 is a structural object having a certain shape. But the analysis object 2 may be fluid, granular material or the like essentially having no definite shape but filled in a space having a definite shape.

Figure 1:
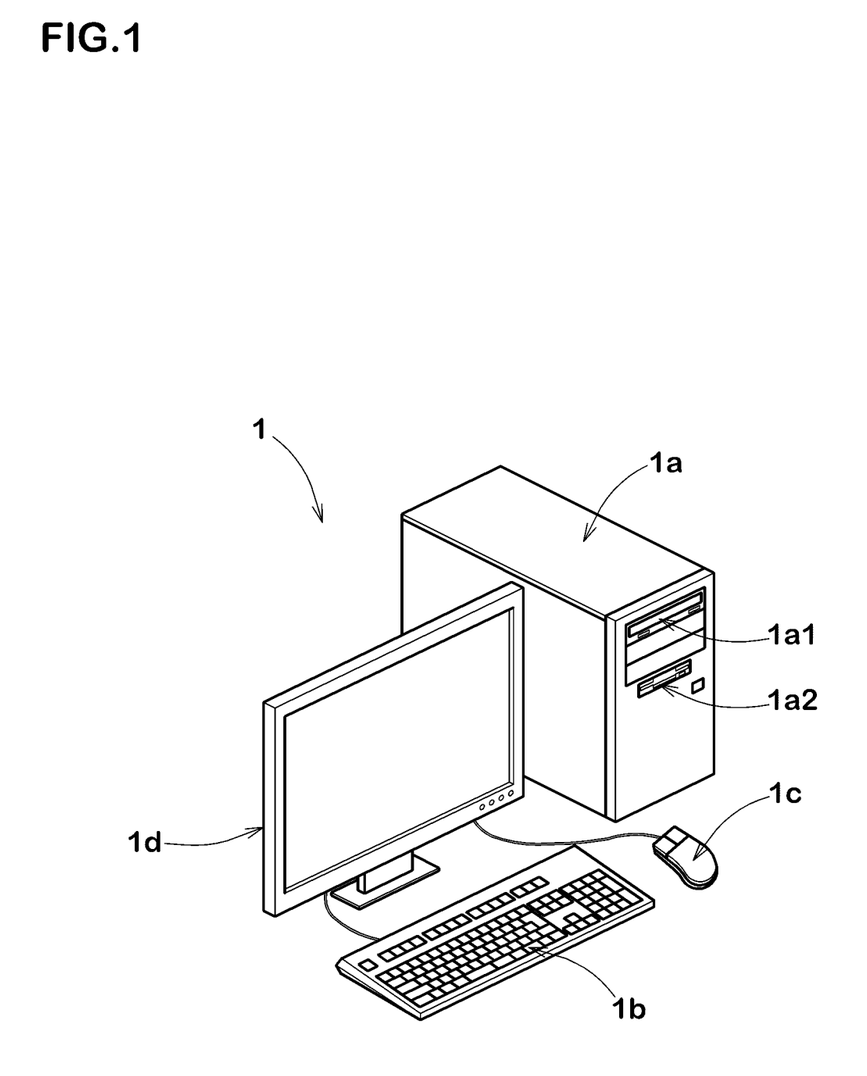
FIG. 1 is a perspective view of a computer for implementing the method according to the present invention.

FIG. 1 shows an example of the computer 1, wherein the computer 1 comprises a main body 1a, a keyboard 1b, a mouse 1c and a display 1d. The main body 1a comprises an arithmetic processing unit (CPU), memory, storage devices such as magnetic disk, disk drives 1a1 and 1a2 and the like. In the storage device, programs/software for carrying out the method are stored.

Figure 2:
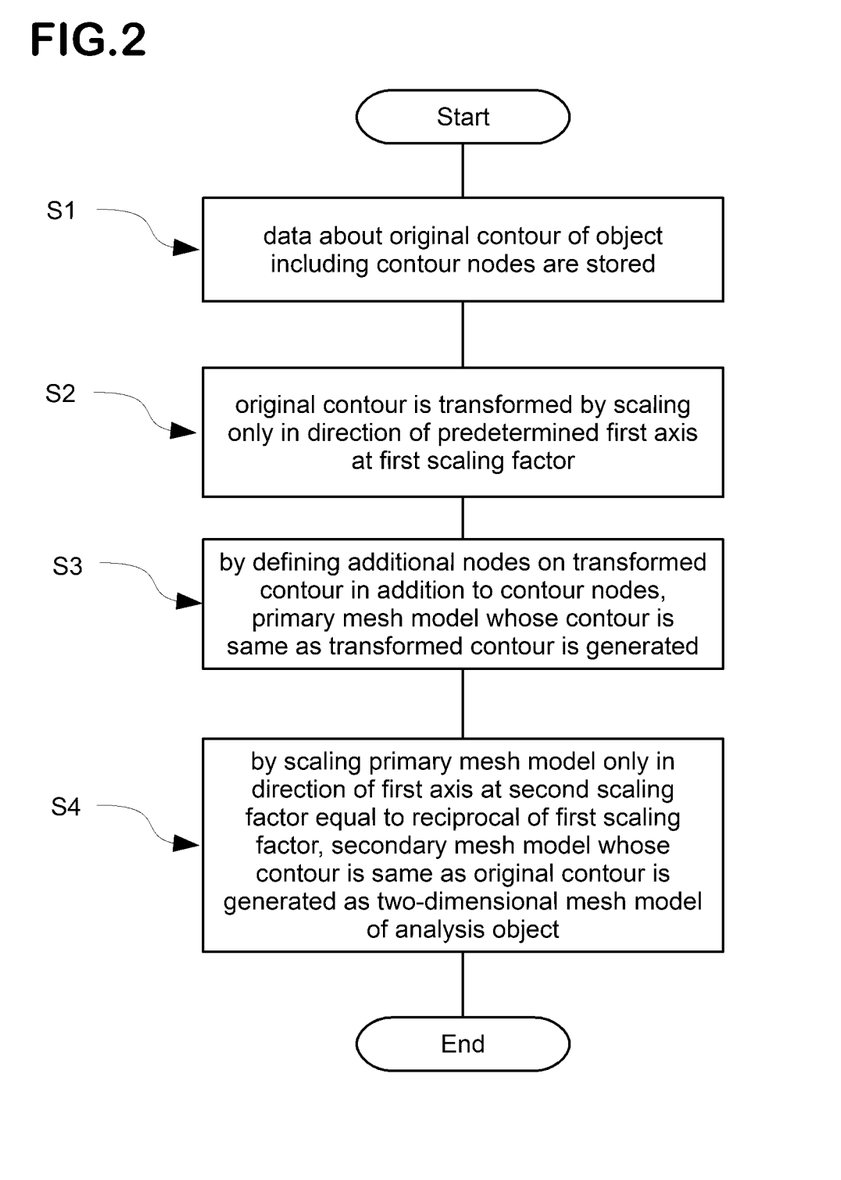
FIG. 2 is a flow chart of a method according to the present invention.

FIG. 2 shows a flow chart of the method according to the present invention.

FIGS. 3(A) to 3(D) show processes of generating a mesh model of the analysis object 2, taking the analysis object 2 having a rectangular contour as an example to explain simply.

As shown in FIG. 2 and FIG. 3, in the first process S1, data D1 about an original contour of the analysis object 2 are entered and stored in the computer 1.

Figure 3A:
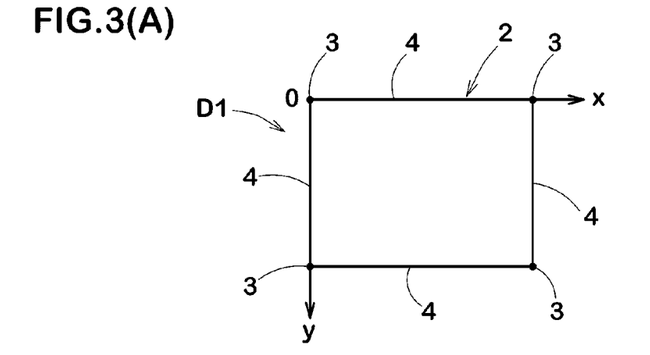
FIGS. 3(A) to 3(D) are diagrams for explaining processes of generating a mesh model of an analysis object.

FIG. 3(A) is a visualization of the data D1 about the original contour which is a two-dimensional contour of the analysis object 2.

The data D1 about the original contour include data about contour nodes 3 which can specify the original contour.

In the simplified example shown in FIG. 3(A) having the a rectangular contour, the data D1 about the original contour include data about four contour nodes 3 which are positioned at four corners of the rectangle.

More specifically, the data D1 about the original contour include the coordinate values of the contour nodes 3 in the employed coordinate system (in this embodiment the Cartesian x-y coordinate system) and information defining connectors between the nodes 3 which correspond to sides 4 between the nodes 3.

Next, the computer 1 performs a transform process S2.

In the transform process S2, the data D1 are calculated such that the original contour is scaled (down/up) only in the direction of a predetermined first axis at a predetermined first scaling factor to obtain a transformed contour, and data D2 about the transformed contour are stored in the computer 1.

Figure 3B:
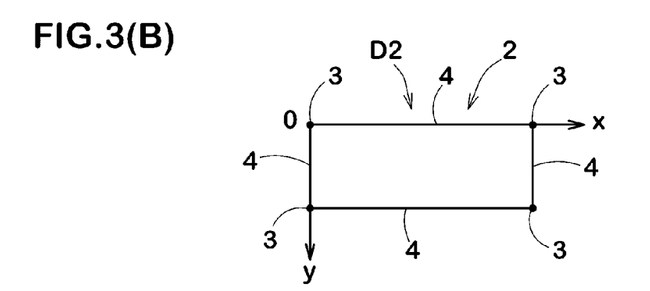

FIG. 3(B) is a visualization of the data D2 about the transformed contour obtained through the transform process S2 from the data D1 about the original contour shown in FIG. 3 (A). The data D2 about the transformed contour shown in FIG. 3(B) are a set of coordinate values of the transformed or shifted nodes calculated from the data D1 about the original contour shown in FIG. 3 (A) by scaling (down) only in the direction of Y-axis at a scaling factor of 0.5.

Generically, the data D2 about the transformed contour are a set of coordinate values of the transformed or shifted nodes calculated from the data D1 about the original contour by scaling (down/up) only in the direction of the predetermined first axis at the predetermined first scaling factor.

In the next process S3, the computer 1 generates a primary mesh model M1 by defining additional nodes 5 on the transformed contour of the data D2 in addition to the contour nodes 3.

Figure 3C:
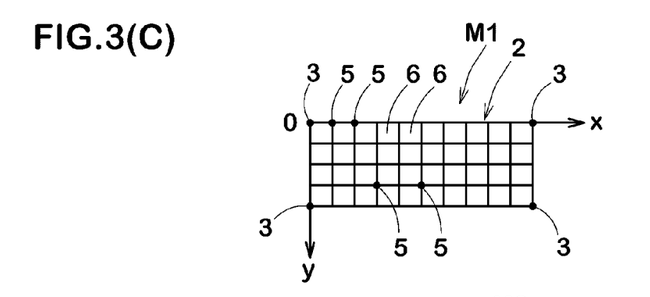

FIG. 3(c) is a visualization of the primary mesh model M1. As shown, in the primary mesh model M1, the newly defined additional nodes 5 are arranged such that the density of the nodes 3, 5 becomes substantially even in each of the X-axis direction and Y-axis direction.

The primary mesh model M1 is meshed with elements 6 whose aspect ratios are substantially 1 (namely, 1+/−0.2), in this embodiment, quadrilateral elements 6.

Such process can be implemented in a meshing software (for example, "Femap", a product of Numerical Simulation Tech Co., Ltd.) having a function to divide evenly.

The coordinate values of the nodes 3 and 5 defining the primary mesh model M1 are stored in the computer 1.

Also, data about information defining connectors between the nodes 3, 5 are stored in the computer 1.

As for the elements 6, the use of a quadrilateral element is preferred, but it is also possible to use a triangular element.

In the process 54, the computer 1 generates a secondary mesh model M2 whose contour is the same as the original contour by scaling (up/down) the primary mesh model M1 only in the direction of the first axis at a second scaling factor which is equal to the reciprocal of the first scaling factor by calculating the coordinate values of the nodes 3 and 5.

Figure 3D:
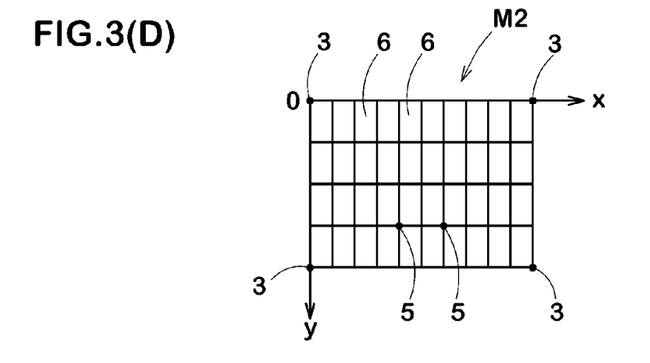

FIG. 3(D) is a visualization of the secondary mesh model M2.

In this example, to generate the secondary mesh model M2, the primary mesh model M1 is scaled up only in the direction of Y-axis at the scaling factor "2" the reciprocal of the first scaling factor "0.5", namely, the secondary mesh model M2 is generated by multiplying the Y-coordinate values of the nodes of the primary mesh model M1 by 2.

The coordinate values of the nodes 3 and 5 of the secondary mesh model M2 are stored in the computer 1.

In the secondary mesh model M2, therefore, the density of the nodes (the number of nodes per unit length) in the direction of the first axis (Y-axis) becomes smaller than the density of the nodes in the direction perpendicular to the first axis (X-axis direction) although the contour of the secondary mesh model M2 is the same as the original contour.

Thus, the elements 6 becomes long in the first axis (Y-axis) direction, and the aspect ratio of each element 6 is substantially 2.

Accordingly, in a numerical simulation utilizing such secondary mesh model M2, physical quantity is computed at relatively large intervals in the direction of the first axis (Y-axis) than in the perpendicular direction thereto. Therefore, with respect to the first axis (Y-axis) direction, the computational cost in the numerical simulation can be reduced.

In the perpendicular direction (X-axis direction), on the other hand, the physical quantity is computed at relatively small intervals which serves to improve the analytical accuracy in this direction.

It is desirable that the direction of the first axis is defined by a low-precision direction in which the gradient of stress (i.e., gradient of a stress distribution curve) or the like is small and therefore the analytical accuracy can be relatively reduced if the analysis object 2 has such low-precision direction.

The number of the elements constituting the secondary mesh model M2 becomes ½ of the number of the elements when the original contour is meshed by the use of the elements shown in FIG. 3(C) having aspect ratios of substantially 1.

Therefore, in a numerical simulation utilizing such secondary mesh model M2, the computational cost can be reduced. According to the method in this embodiment, an efficient mesh model capable of reducing the computational cost without sacrificing the analytical accuracy can be generated easily without bothering the hand of an operating personnel.

In the transform process of the above-described embodiment, the original contour is scaled down at a scaling factor smaller than 1. But, needless to say, the original contour can be scaled up at a scaling factor larger than 1.

Figure 4A:
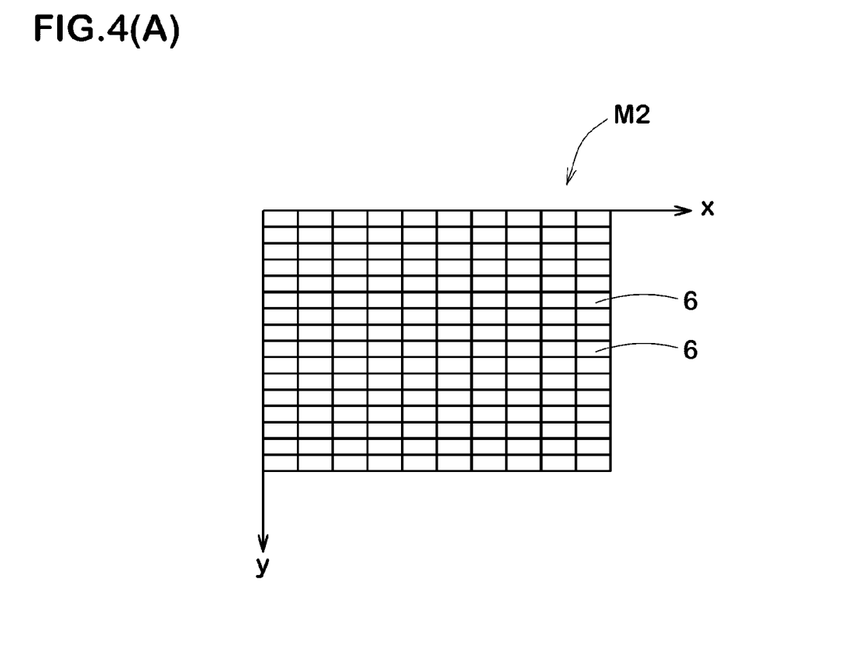
FIG. 4(A) is a visualization of another example of the mesh model starting from the same original contour as that in FIG. 3(A).

FIG. 4(A) shows a secondary mesh model M2 generated as follows. The original contour shown in FIG. 3(A) is scaled up only in the direction of Y-axis at a scaling factor of "2" and meshed by the use of the elements having aspect ratios of substantially 1 to generate a primary mesh model M1.

Then, the primary mesh model M1 is scaled down only in the direction of Y-axis at a scaling factor of "½".

Accordingly, the secondary mesh model M2 is made up of elements 6 whose aspect ratios are 0.5.

In the secondary mesh model M2 in this embodiment, the density of the nodes in the direction of Y-axis (first axis) is higher than that in the direction of X-axis.

In a simulation utilizing the secondary mesh model M2 in this embodiment, therefore, the analytical accuracy in the direction of Y-axis can be improved because the physical quantity which is computed at the positions of the nodes is computed densely in the direction of Y-axis.

In this embodiment, therefore, if the analysis object 2 has a high-precision direction in which the gradient of stress or the like is relatively large and it is desirable that the analytical accuracy is relatively increased, then it is preferred that the direction of the first axis is defined by such high-precision direction.

Figure 4B:
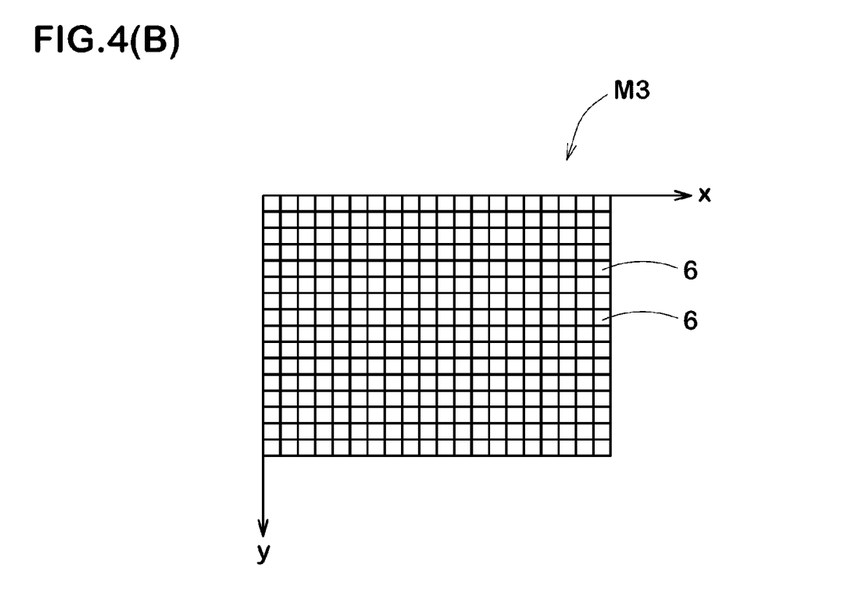
FIG. 4(B) is a visualization of a mesh model generated according to the conventional method starting from the same original contour as that in FIG. 3(A).

FIG. 4(B) shows a mesh model M3 generated by utilizing elements whose aspect ratios are 1 to have the same Y-axis-direction precision as FIG. 4(A).

When compared with the number of the elements of this mesh model shown in FIG. 4(B), the secondary mesh model M2 of the embodiment shown in FIG. 4(A) becomes one half.

Accordingly, without decreasing the analytical accuracy in the Y-axis direction, the computational cost can be reduced.

Figure 5:
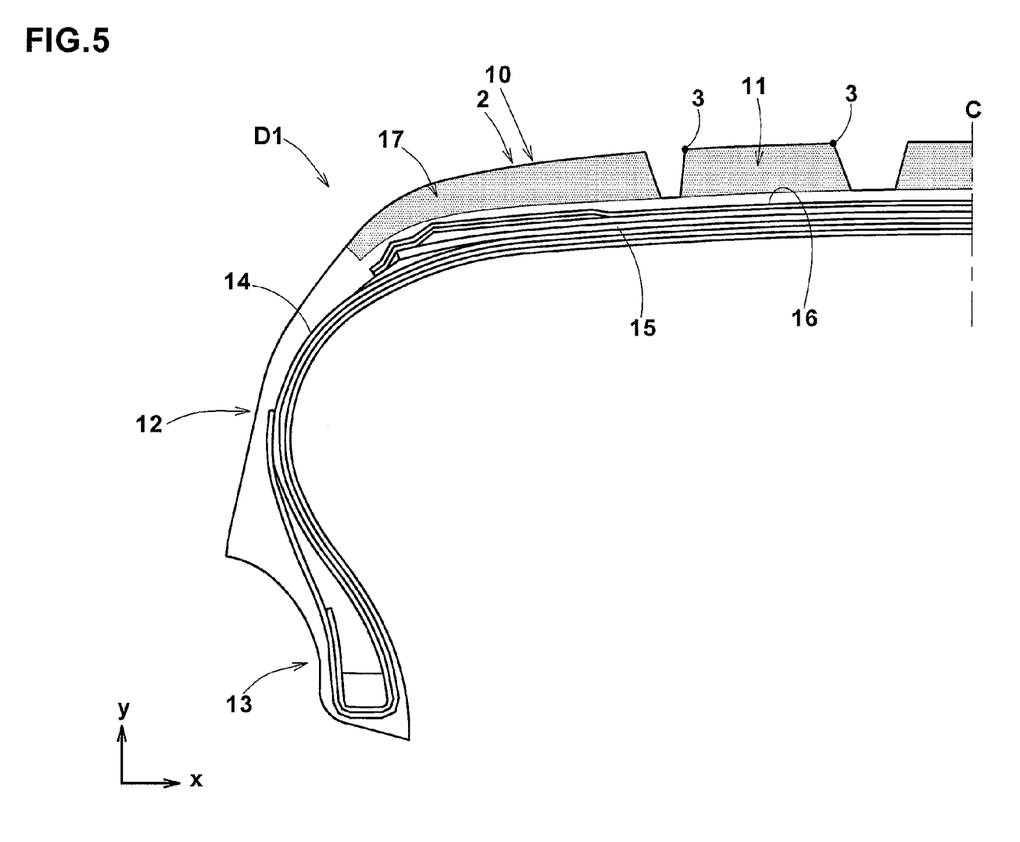
FIG. 5 is a visualization of data about the original contour of the analysis object which is a pneumatic tire, in the tire meridian section.

FIG. 5 shows a pneumatic tire 10. The tire 10 is geometrically symmetric about the tire equator C.

The tire 10 comprises a tread portion 11, a pair of sidewall portions 12, a pair of bead portions 13, a toroidal carcass 14, a belt 15 radially outside the carcass 14, a band 16 on the radially outside of the belt 15, and rubber members disposed outside the carcass 10 and the belt/band.

The rubber members include a cap tread rubber 17 provided with tread grooves defining a tread pattern.

In the case that such tire 10 is the analysis object 2, the contour of the above-mentioned data D1 include the contour of the tire 10 as a whole as well as the contours of the respective structural members constituting the tire 10.

Data about the coordinates of the nodes specifying such contours and connector between the nodes are stored in the computer 1.

Figure 6:
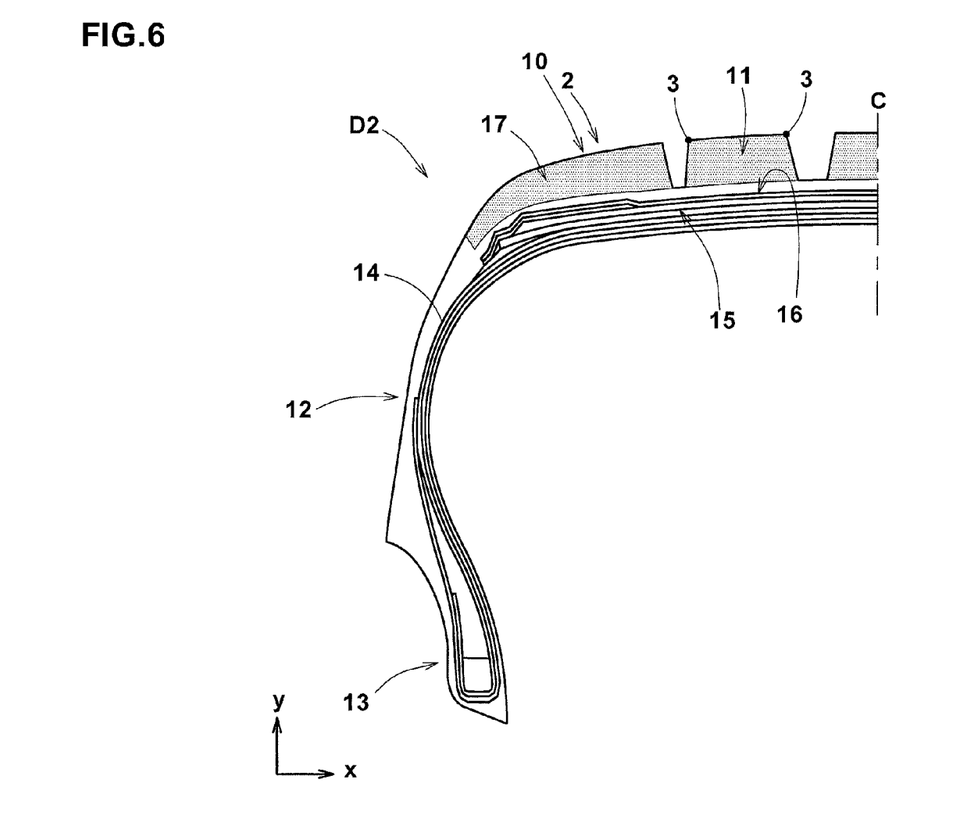
FIG. 6 is a visualization of the data about the transformed contour obtained such that the original contour of the tire shown in FIG. 5 is scaled down in the tire axial direction at a scaling factor "2/3".

FIG. 6 is a visualization of the data D2 about the transformed contour of the tire 10.

In this embodiment, only in the direction of the rotational axis of the tire (X-axis) as the first axis, the original contour (data D1) is scaled down at a scaling factor "⅔".

Figure 7:
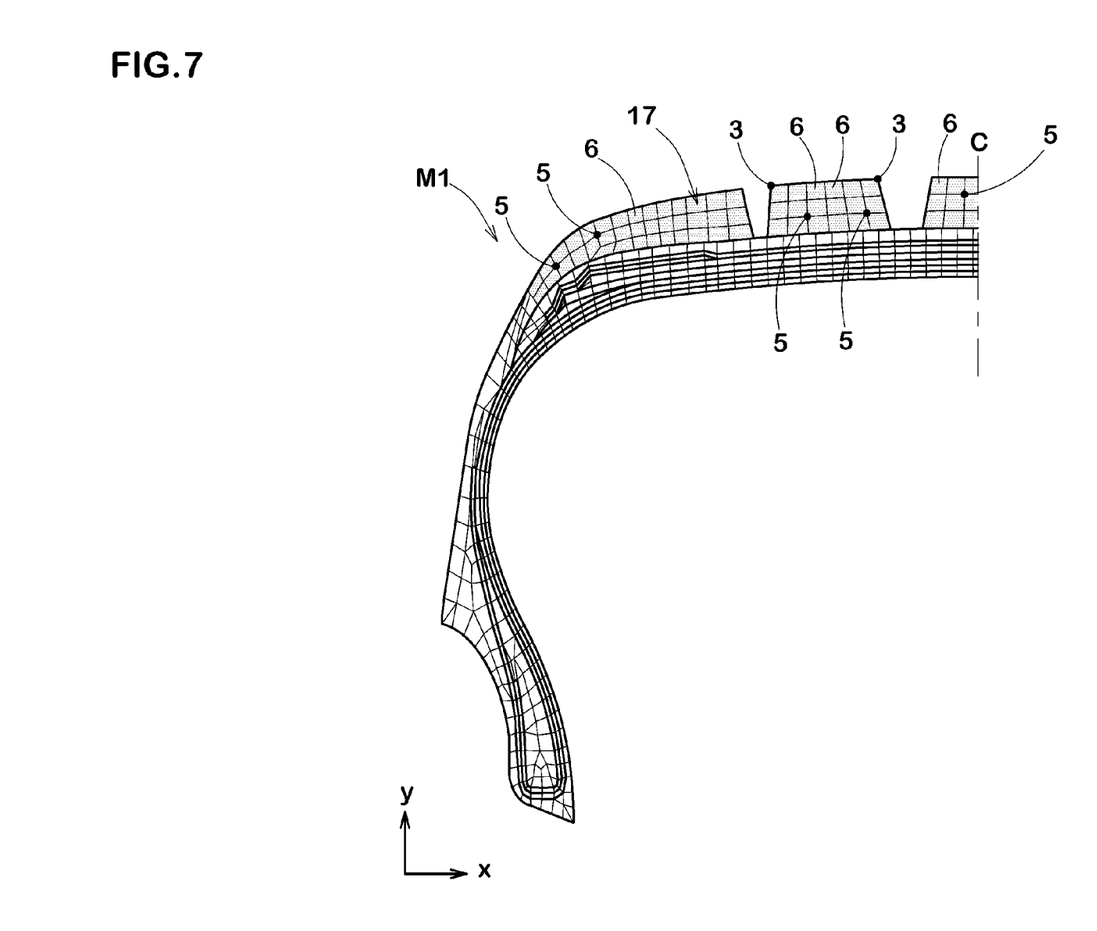
FIG. 7 is a visualization of the primary mesh model of the tire generated based on the transformed contour shown in FIG. 6.

FIG. 7 shows the primary mesh model M1 generated by defining nodes 5 on the transformed contour (data D2), shown in FIG. 6, and meshing based on all the nodes 3 and 5.

Thus, in the primary mesh model M1, all of the structural members including the rubber members are meshed. In this embodiment, the tread cap rubber 17 is defined by quadrilateral elements 6. Other portions are defined by quadrilateral elements 6 and triangular elements 6. Excepting the internal structural members, the rubber portions are divided into elements whose aspect ratios are substantially 1(1+/−0.2).

Figure 8:
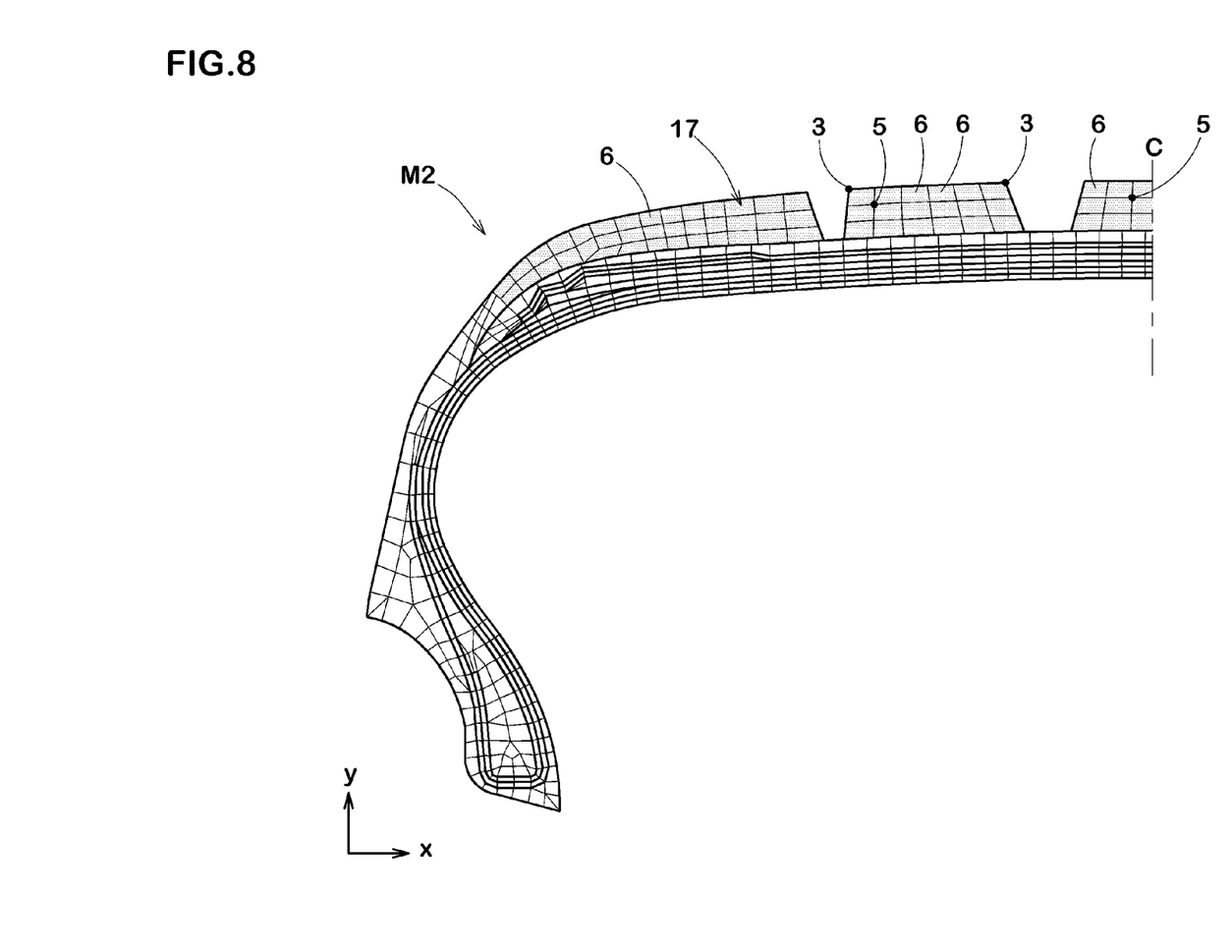
FIG. 8 is a visualization of the secondary mesh model of the tire generated from the primary mesh model shown in FIG. 7.

FIG. 8 is a visualization of the secondary mesh model M2 generated by scaling up the primary mesh model M1 of FIG. 7 only in the X-axis direction at the second scaling factor "3/2" or the reciprocal of the first scaling factor "⅔", namely, by multiplying the x-coordinate values of the nodes 3 and 5 of the model M1 by 3/2.

Accordingly, the secondary mesh model M2 has the same contour as the original contour.

In the secondary mesh model M2, therefore, the density of the nodes in the tire axial direction is relatively decreased without changing the density of the nodes in the tire radial direction.

Thus, the secondary mesh model M2 in this embodiment is suitable for such a numerical simulation that the tire axial direction is the low-precision direction (or the high-precision direction is the tire radial direction).

For example, a numerical simulation in which vertical loads are applied to the tire is included in such numerical simulation.

Figure 9:
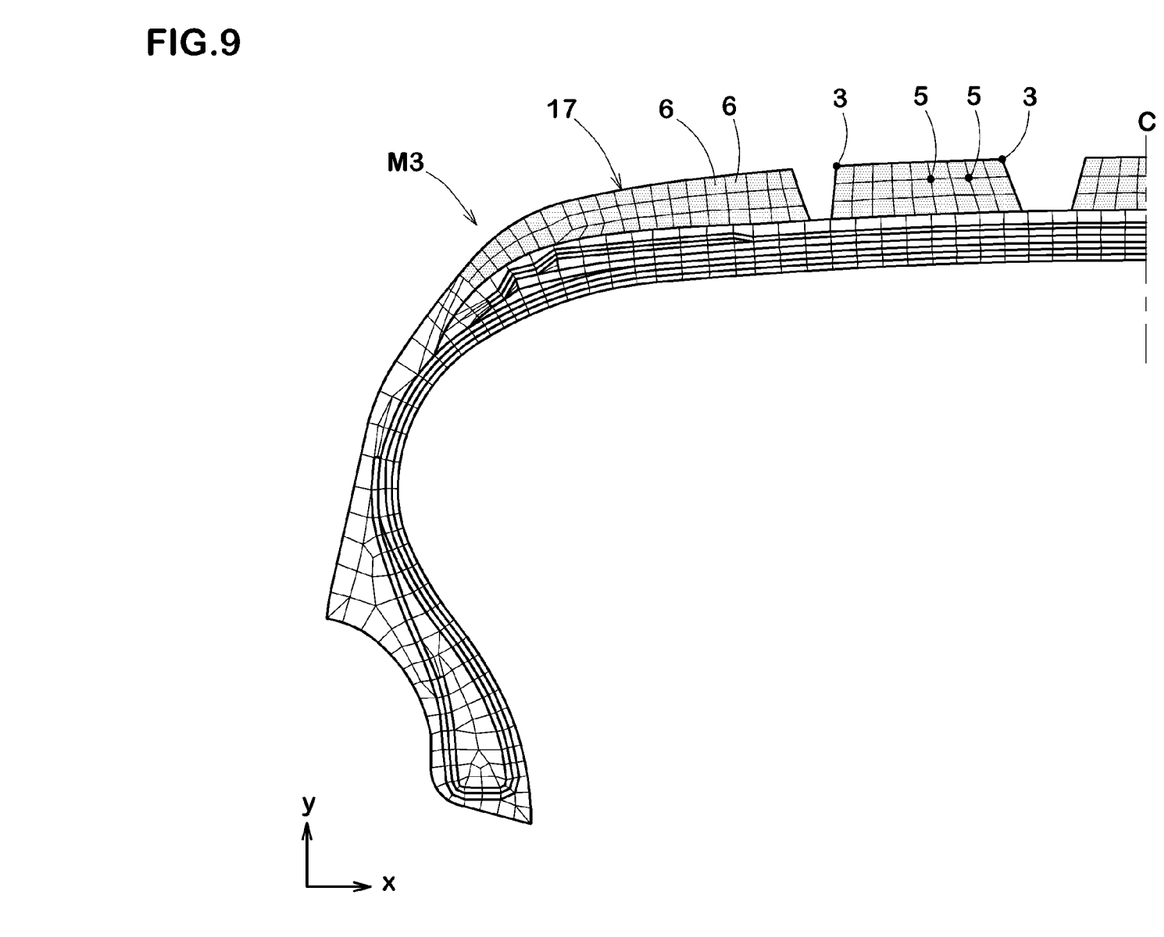
FIG. 9 is a visualization of a mesh model of the tire generated according to the conventional method.

FIG. 9 is a visualization of a mesh model M3 in which the tread cap rubber 17 is divided evenly in the tire axial direction and tire radial direction, as is conventional.

In the tread cap rubber 17, the density of the nodes in the Y-axis direction is same as that of the FIG. 8 model.

Therefore, in the secondary mesh model M2 shown in FIG. 8, the number of the elements representing the tread cap rubber is decreased.

Excepting the tread cap rubber 17, the FIG. 9 model M3 is the same as the FIG. 8 model.

Figure 10:
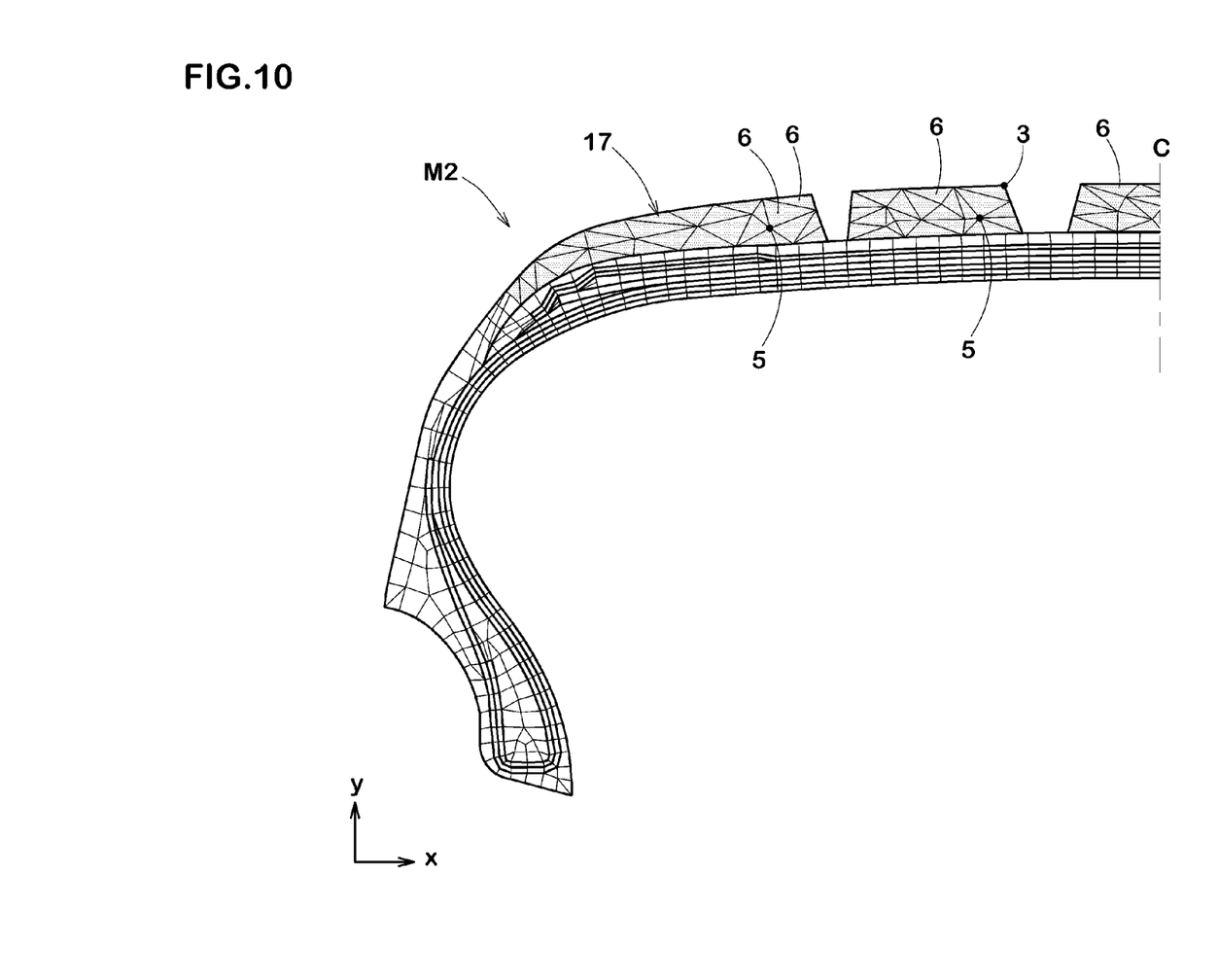
FIG. 10 is a visualization of another example of the secondary mesh model of the tire generated according to the present invention.

FIG. 10 shows still another embodiment of the present invention.

In FIG. 10, the secondary mesh model M2 of the tire has the same original contour as FIG. 5.

In this secondary mesh model M2, the tread cap rubber 17 is modeled by the use of triangular elements 6. Other portions are same as FIG. 8.

Figure 11:
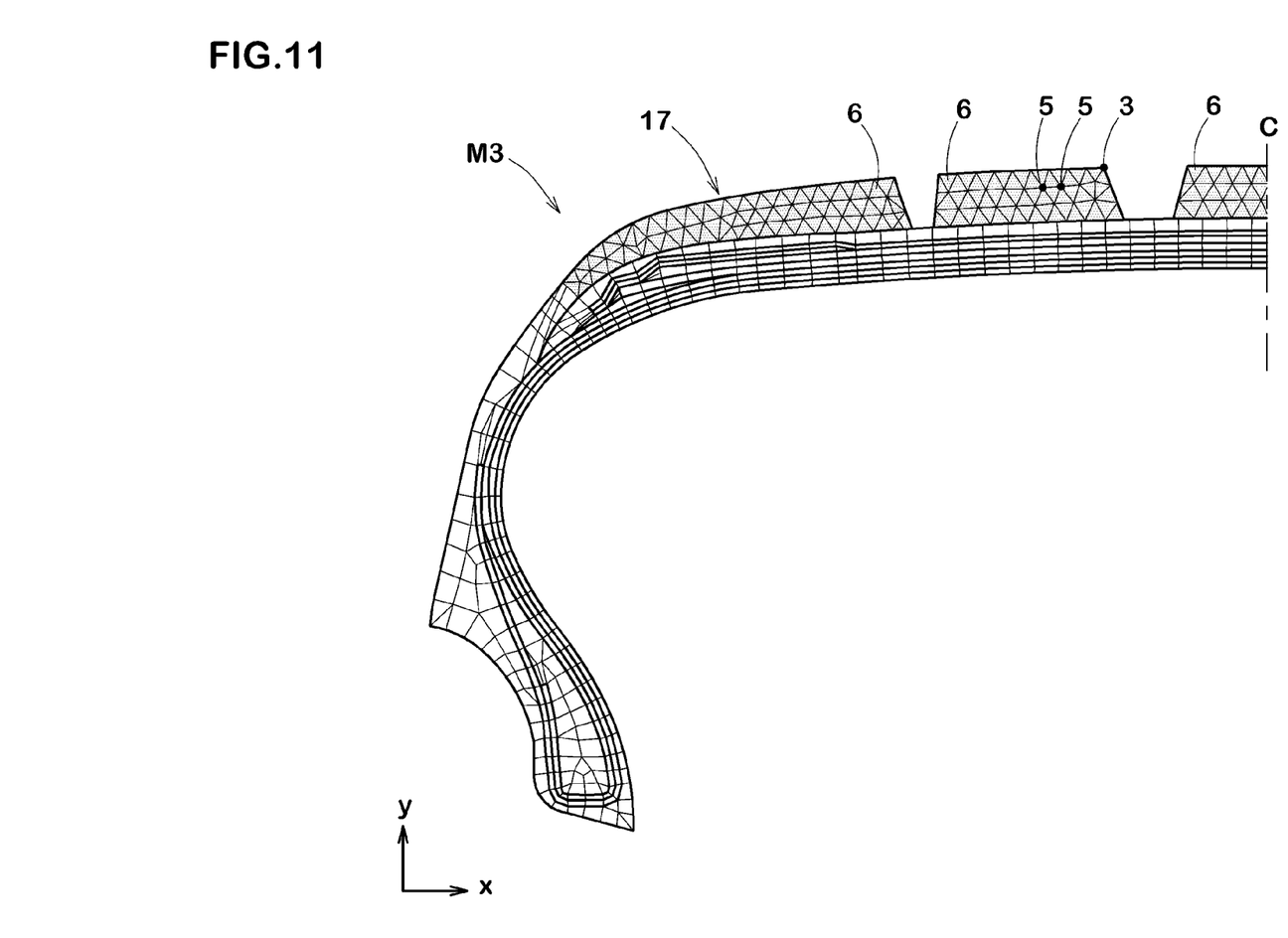
FIG. 11 is a visualization of a mesh model of the tire generated according to the conventional method.

FIG. 11 shows a mesh model M3 of a tire having the same contour as FIG. 5, wherein the tread cap rubber 17 is modeled by the use of triangular elements 6, and which is generated by the conventional method (dividing evenly in the tire axial direction and tire radial direction).

When compared with this mesh model M3, the tread cap rubber 17 in the secondary mesh model M2 shown in FIG. 10 as an embodiment can be modeled by a less number of the elements than the mesh model M3.

Comparison Tests

According to the procedure shown in FIG. 2, secondary mesh models M2 (Ex. 1 and Ex. 2) of a pneumatic tire (size 235/50 R18) were generated. For comparison, mesh models (Ref. 1 and Ref. 2) of the same pneumatic tire were generated according to the conventional method (dividing evenly in the tire axial direction and tire radial direction). Those mesh models and generating methods were compared as follows.

<Simulation Accuracy Test>

With respect to each of the mesh models, the vertical spring constant of the tire under a tire load of 5 kN and a tire pressure of 230 kPa was calculated by the use of a software for finite element analysis "ABAQUS" a product of ABAQUS, Inc.

The results are indicated in Table 1 by an index based on the measured vertical spring constant of the actual tire being 100. If the index number is within the range of 95 to 105, the accuracy is considered as being good.

Further, the analysis time (taken to obtain the vertical spring constant) and also the mesh-model-generating time were measured with respect to each of the mesh models. The results are indicated in Table 1.

TABLE 1

|  | Ref. 1 | Ex. 1 | Ref. 2 | Ex. 2 |
| --- | --- | --- | --- | --- |
| mesh model | FIG. 9 | FIG. 8 | FIG. 11 | FIG. 10 |
| element shape | quadrilateral | quadrilateral | triangular | triangular |
| number of elements constituting tread cap rubber | 181 | 125 | 750 | 221 |
| number of elements constituting the rest (*) | 1800 | 1800 | 1800 | 1800 |
| accuracy | 102 | 102 | 104 | 104 |
| model generating time (hour) | 0.5 | 0.75 | 0.5 | 0.75 |
| analysis time(hour) | 2.5 | 2 | 6 | 3 |
| total time (hour) | 3 | 2.75 | 6.5 | 3.75 |

(*) the rest of the tire excepting the tread cap rubber

The invention claimed is:

1. A computer-implemented method for generating a two-dimensional mesh model of an analysis object, which model is made up of a finite number of elements and provided with a plurality of nodes, comprising
a process in which data about an original contour of the analysis object, including data about contour nodes which can specify the original contour, are stored,
a transform process in which the original contour is transformed by scaling the original contour only in the direction of a predetermined first axis at a predetermined first scaling factor to obtain data about the transformed contour,
a mesh process in which, by defining additional nodes on the transformed contour in addition to the contour nodes, and by meshing based on all the additional nodes and the contour nodes, a primary mesh model whose contour is the same as the transformed contour is generated, and
an inverse transform process in which, by scaling the primary mesh model only in said direction of the first axis at a second scaling factor equal to the reciprocal of the first scaling factor, a secondary mesh model whose contour is the same as the original contour is generated as the two-dimensional mesh model of the analysis object.

2. The method according to claim 1, wherein
the analysis object has a low-precision direction in which an analytical accuracy can be relatively reduced, and
in the transform process, the original contour is scaled down only in the low-precision direction as the direction of the first axis.

3. The method according to claim 2, wherein
the analysis object is a tire,
the original contour is a contour of the tire in a tire meridian section, and
the direction of the first axis is the direction of the axis of rotation of the tire.

4. The method according to claim 1, wherein
the analysis object has a high-precision direction in which an analytical accuracy is required to be relatively increased, and
in the transform process, the original contour is scaled up only in the high-precision direction as the direction of the first axis.

5. The method according to claim 4, wherein
the analysis object is a tire,
the original contour is a contour of the tire in a tire meridian section, and
the direction of the first axis is perpendicular to the direction of the axis of rotation of the tire.

6. The method according to claim 1, wherein
the analysis object is a tire,
the original contour is a contour of the tire in a tire meridian section, and
the direction of the first axis is the direction of the axis of rotation of the tire.

7. The method according to claim 1, wherein
the analysis object is a tire,
the original contour is a contour of the tire in a tire meridian section, and
the direction of the first axis is perpendicular to the direction of the axis of rotation of the tire.

* * * * *